United States Patent
Dunn et al.

(10) Patent No.: US 6,232,042 B1
(45) Date of Patent: May 15, 2001

(54) METHOD FOR MANUFACTURING AN INTEGRAL THIN-FILM METAL RESISTOR

(75) Inventors: Gregory J. Dunn, Arlington Heights; Jovica Savic; Allyson Beuhler, both of Downers Grove, all of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/111,189

(22) Filed: Jul. 7, 1998

(51) Int. Cl.⁷ ......................................... G03F 7/00
(52) U.S. Cl. .................. 430/315; 430/313; 430/324; 427/96; 427/126.6
(58) Field of Search .................. 430/313, 315, 430/324; 427/96, 126.6

(56) References Cited

U.S. PATENT DOCUMENTS

| | | | |
|---|---|---|---|
| 3,719,508 | * 3/1973 | Gulla | 106/1.27 |
| 4,786,564 | * 11/1988 | Chen | 428/694 |
| 4,888,574 | 12/1989 | Rice et al. | 338/309 |
| 4,892,776 | 1/1990 | Rice | 428/209 |
| 5,053,318 | * 10/1991 | Gulla | 430/315 |
| 5,336,391 | 8/1994 | Rice | 205/152 |
| 5,347,258 | 9/1994 | Howard et al. | 338/333 |
| 5,403,672 | 4/1995 | Urasaki et al. | 428/607 |
| 5,560,812 | 10/1996 | Kiyokawa | 205/163 |
| 5,679,498 | * 10/1997 | Greenwood | 430/312 |
| 6,171,921 | * 1/2001 | Dunn | 438/382 |

FOREIGN PATENT DOCUMENTS

00/07197 * 2/2000 (WO).

OTHER PUBLICATIONS

Mahler, et al., "Planar Resistor Technology for High-Speed Multilayer Boards", *Electronic Packaging & Production*, Jan., 1986, pp. 1–5.

* cited by examiner

Primary Examiner—Mark F. Huff
Assistant Examiner—Nicole Barreca
(74) Attorney, Agent, or Firm—Douglas D. Fekete

(57) ABSTRACT

A method for manufacturing a microelectronic assembly to have a resistor, and particularly a metal resistive film, with desirable processing and dimensional characteristics. The method generally entails applying a photosensitive dielectric to a substrate to form a dielectric layer. The dielectric layer is photoimaged to polymerize a first portion of the dielectric layer on a first region of the substrate, leaving the remainder of the dielectric layer unpolymerized. An electrically resistive film is then applied to the dielectric layer, and the dielectric layer is developed to remove concurrently the unpolymerized portion thereof and the portion of the resistive film overlying the unpolymerized portion, so that a portion of the resistive film remains over the second portion to form the resistor. An alternative process order is to apply the resistive film prior to exposing the dielectric layer to radiation, and then exposing the dielectric layer through the resistive film. The resistive film is preferably a multilayer film that includes an electrically resistive layer, such as NiP, NiCr or another nickel-containing alloy, and a sacrificial backing such as a layer of copper.

11 Claims, 4 Drawing Sheets

METHOD FOR MANUFACTURING AN INTEGRAL THIN-FILM METAL RESISTOR

This invention was made with Government support under Agreement No. F33615-96-2-1838 awarded by DARPA. The Government has certain rights in the invention.

BACKGROUND OF THE INVENTION

1. Field of the Invention

The present invention generally relates to electrical circuits and their fabrication. More particularly, this invention relates to a relatively uncomplicated process for forming thin-film metal resistors with improved dimensional tolerances.

2. Description of the Prior Art

Thin-film metal resistors have been employed in hybrid electronic circuits generally by vacuum deposition on small substrates. Nickel-based compositions such as nickel-chromium are often used, as well as other materials such as chromium silicide and tantalum nitride. Nickel-phosphorus thin film resistors have also been formed by lamination of large sheets of Ni-P-plated copper foil in printed circuit board constructions, with subsequent subtractive etching steps to define the resistors. These subtractive etching processes present the drawback of poor dimensional control due to the undercut effects of isotropic wet etching. To ensure a linear relationship between resistor aspect ratio (L/W) and resistance, a single resistor width is often used for all aspect ratios within a circuit, which imposes an undesirable restriction on the circuit layout or design. A second drawback of subtractive etching is that chemical etchants for the resistor metal are different from those typically employed in circuit board fabrication.

Accordingly, it would be desirable if a method were available that reduced the complexity of processing metal integral resistors while also promoting accurate control of resistance tolerances.

SUMMARY OF THE INVENTION

According to the present invention, there is provided a method for manufacturing a microelectronic assembly to have a resistor, and particularly a metal resistive film, with desirable processing and dimensional characteristics. The method generally entails applying a photosensitive dielectric to a substrate to form a dielectric layer. The dielectric layer is photoimaged such that a first portion of the dielectric layer on a first region of the substrate is soluble, while a second portion of the dielectric layer on a second region of the substrate is insoluble. An electrically resistive film is then applied to the dielectric layer, and the dielectric layer is developed to remove concurrently the first portion thereof and a portion of the resistive film overlying the first portion, so that a portion of the resistive film remains over the second portion to form the resistor. An alternative process order is to apply the resistive film prior to exposing the dielectric layer to radiation, and then exposing the dielectric layer through the resistive film. This technique requires that the thickness and electromagnetic properties of the resistive film permit electromagnetic penetration through the film to allow activation of the photosensitive characteristics of the photosensitive dielectric.

According to this invention, the resistive film is preferably a multilayer film that includes an electrically resistive layer, such as NiP, NiCr or another nickel-containing alloy, and a backing such as a layer of copper. Once laminated to the dielectric layer, the copper layer can be selectively removed using conventional etchants to leave the resistive layer on the surface of the dielectric layer. Alternatively, the resistive film can be formed by electroless plating or by evaporating or sputtering onto the dielectric layer. The method of this invention also preferably entails applying a second dielectric layer over the first dielectric layer after developing the first dielectric layer, forming openings in the second dielectric layer to expose portions of the remnant electrically resistive film, and then plating the exposed portions of the resistive film to form terminals for electrical connection to the film.

According to the above, the preferred method of this invention entails only a single metal etch using conventional etchants in order to selectively remove the backing of the film laminate. Therefore the present invention is not complicated by multiple etch steps with nonstandard etchants as are prior art methods for forming metal integral resistors. Importantly, the present method also achieves excellent edge definition of the resistor during the process of removing the excess portion of the resistive layer with the soluble portion of the dielectric layer. As a result of this technique, the width of the resistor can be accurately controlled without any undercutting of the resistor. Finally, the method of this invention achieves accurate placement of the terminals for the resistor using photodefinition, thereby accurately determining the electrical length of the resistor. Consequently, the dimensional and resistance tolerances of a metal integral resistor produced by the method of this invention are tighter than those possible with prior art methods.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing, in which.

DETAILED DESCRIPTION OF THE PREFERRED EMBODIMENT

Figure 2:
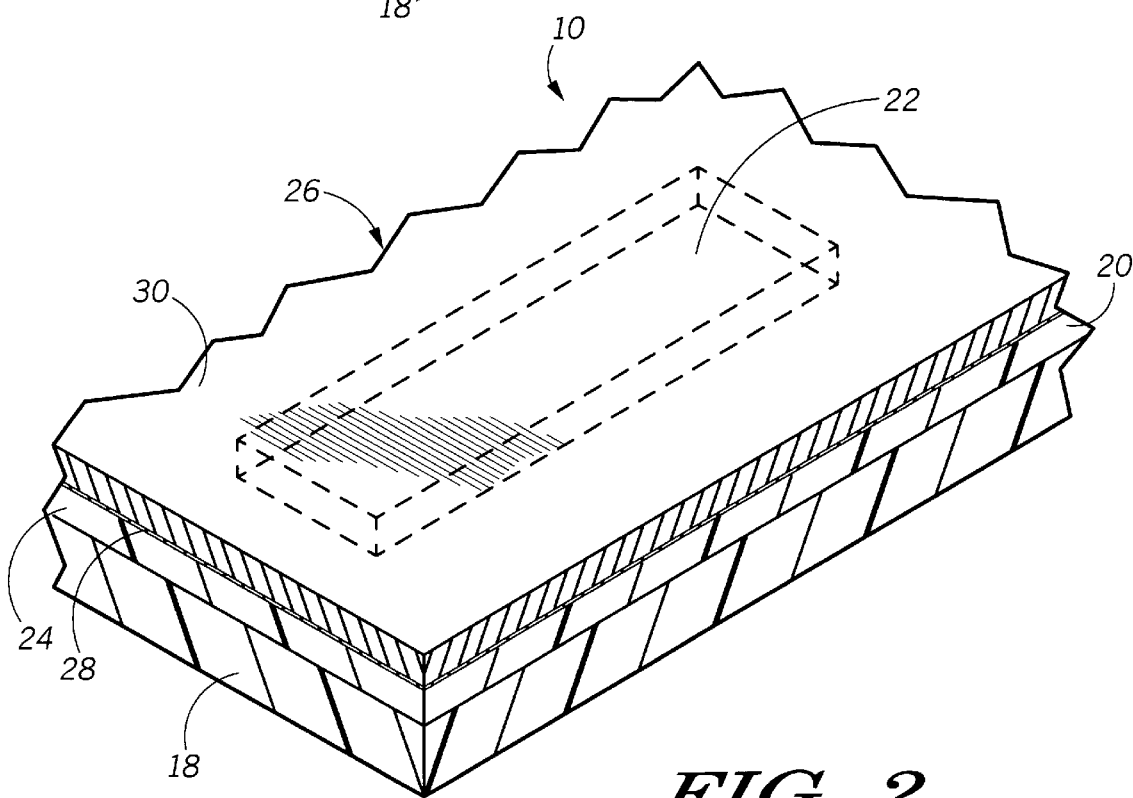
Figure 3:
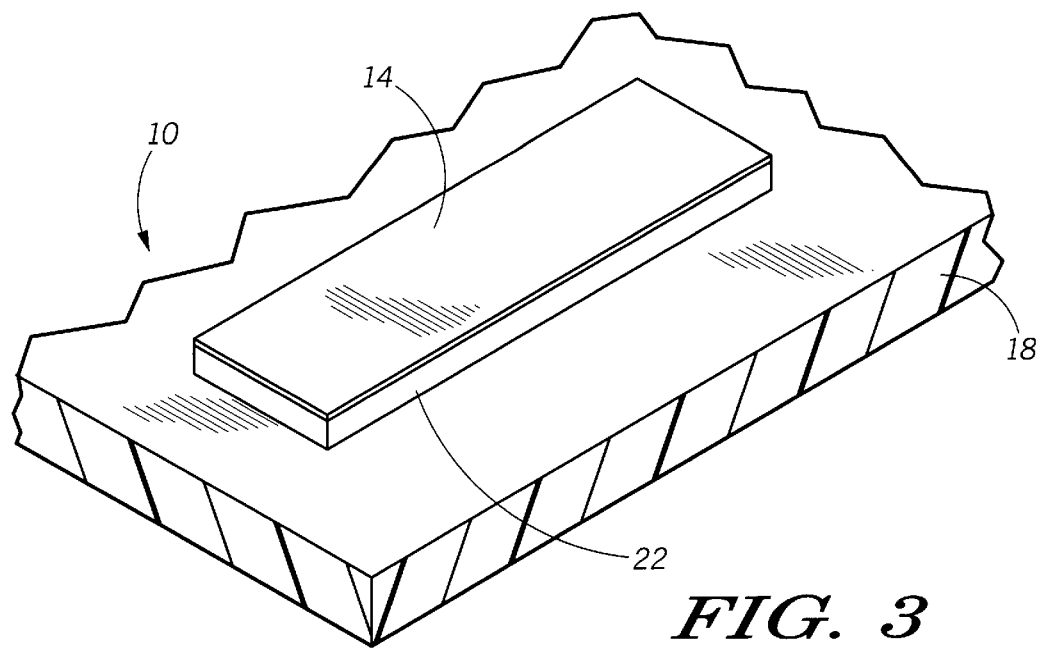
Figure 4:
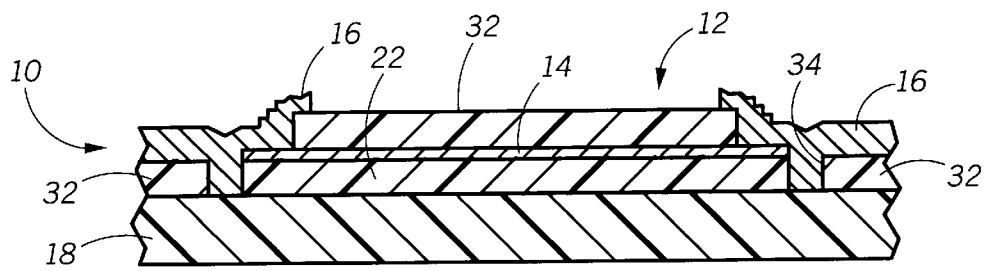
Figure 5:
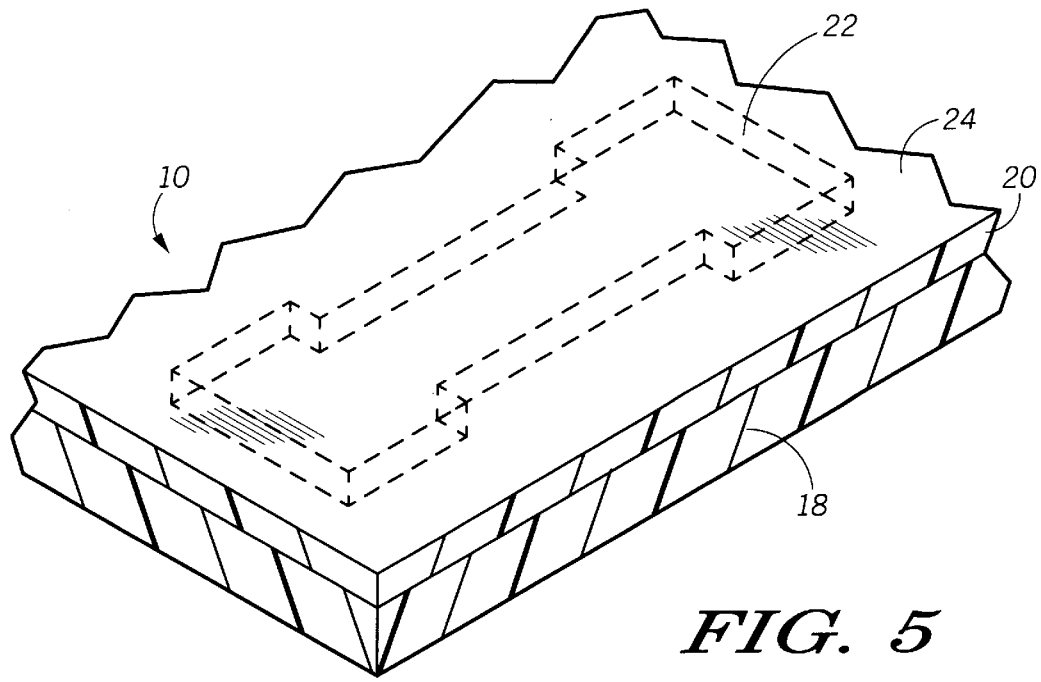
FIGS. 5 through 8 are perspective views showing process steps for forming a metal integral resistor in accordance with a second embodiment of this invention.
Figure 6:
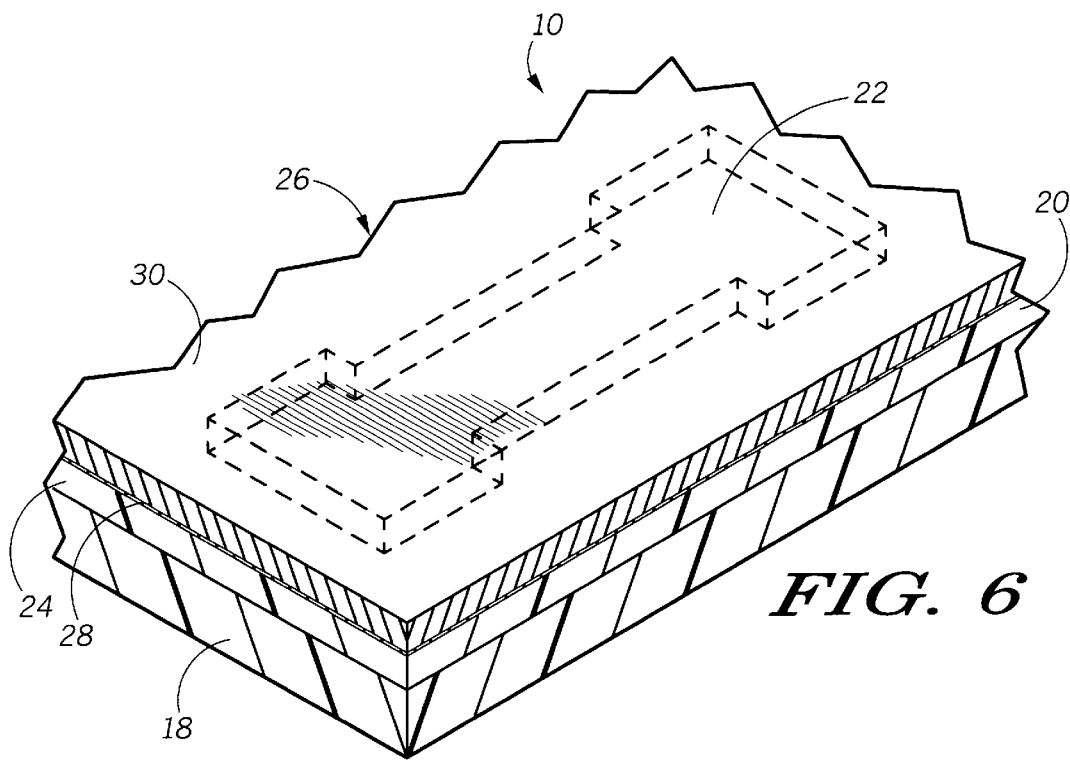
Figure 7:
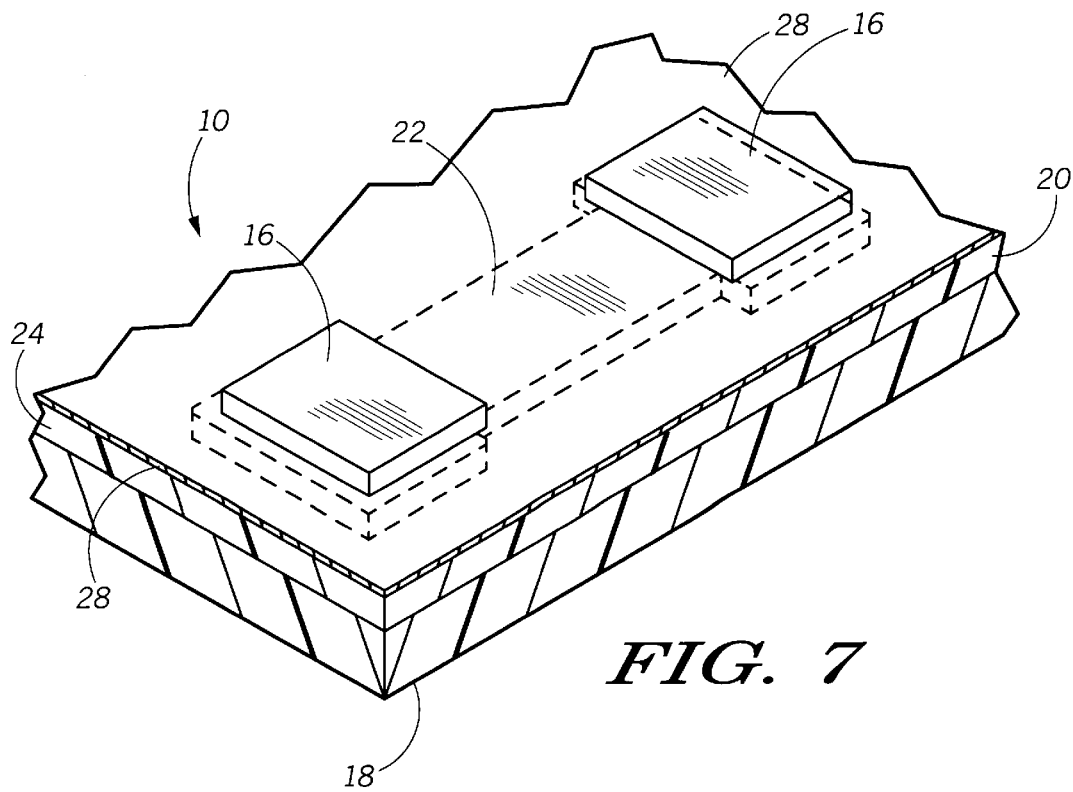
Figure 8:
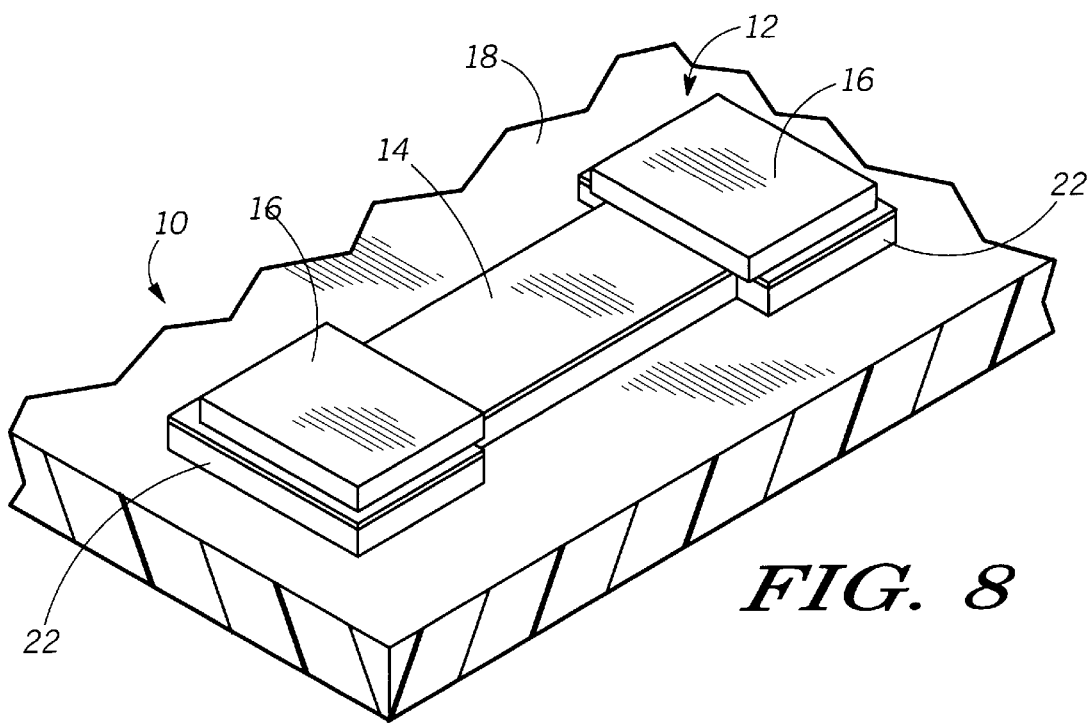
Figure 9:
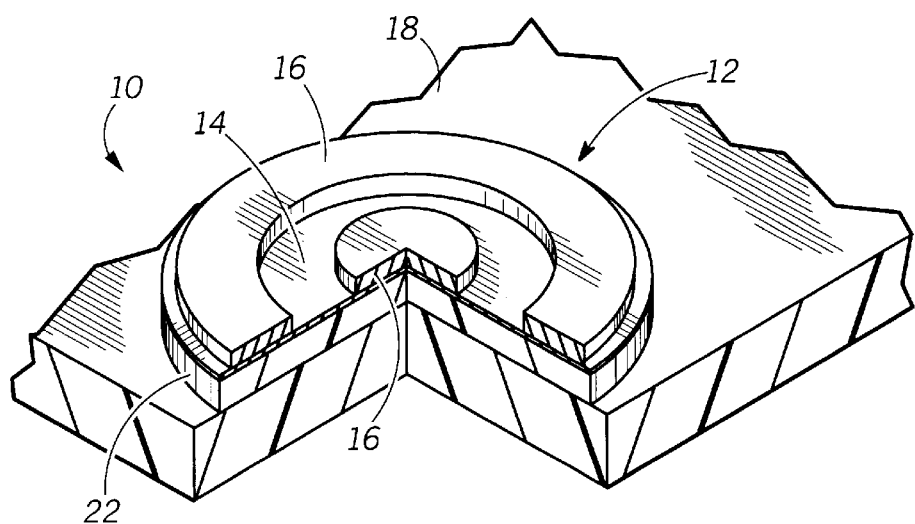
FIG. 9 is a perspective view of an annular resistor formed by the process steps of either FIGS. 1 through 4 or FIGS. 5 through 8.

A portion of a circuit board 10 processed to have a metal integral resistor 12 in accordance with this invention is represented in FIGS. 1 through 4. As shown in FIG. 4, the resistor 12 comprises a resistive film 14 and a pair of terminations 16 that determine the electrical length of the resistor 12. As will be described below with reference to FIGS. 1 through 4, accurate physical dimensions for the resistor 12 are achieved with this invention, such that the resistor 12 can have accurately controlled resistance tolerances. While a particular resistor-termination configuration is shown in FIG. 4, those skilled in the art will appreciate that numerous variations and modifications are possible, including those of FIGS. 8 and 9, and such variations and modifications are within the scope of this invention.

Figure 1:
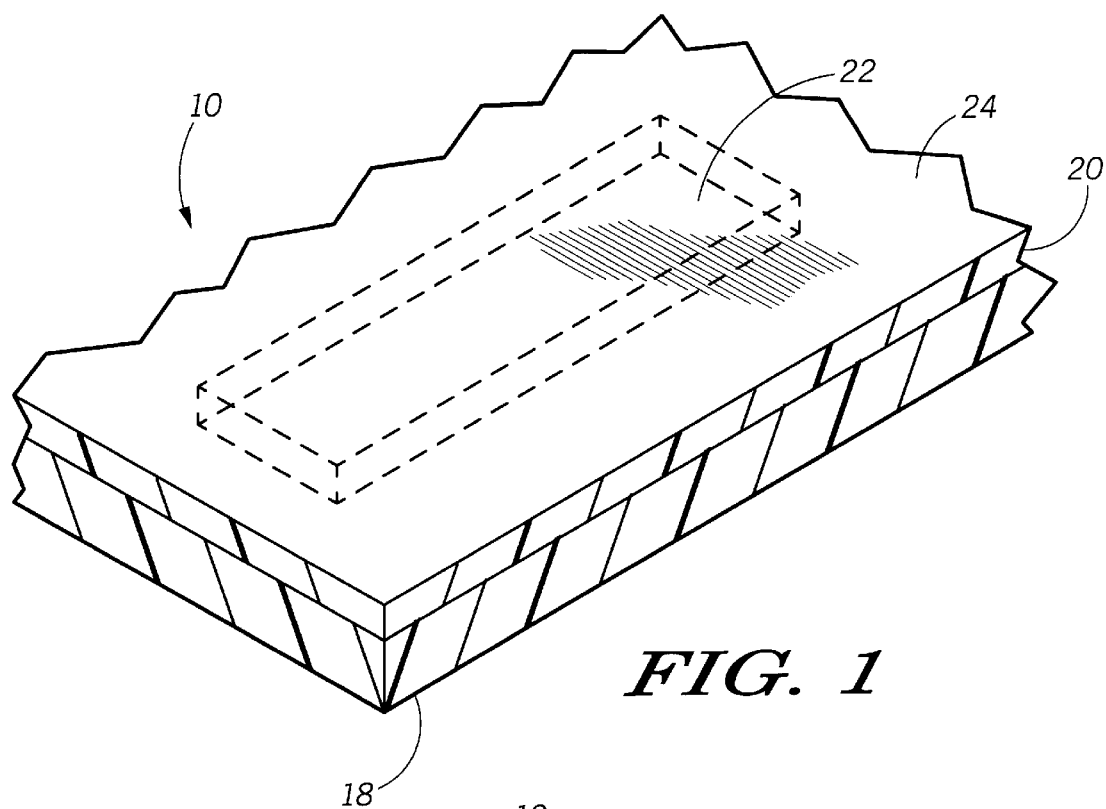
FIGS. 1 through 3 are perspective views and FIG. 4 is a crosssectional view showing process steps for forming a metal integral resistor in accordance with a first embodiment of this invention.

Referring to FIG. 1, the circuit board 10 is shown as having a substrate 18 on which a dielectric layer 20 has been formed. The substrate 18 can be any suitable material, including a printed wiring board, a flexible circuit, a ceramic or silicon substrate, or another dielectric layer of a multi-layer circuit, though other suitable substrates and materials could also be used. The dielectric layer 20 is formed of a positive or negative photoimagable thick-film polymer, such that known photoimaging and development techniques can be employed to pattern the dielectric layer 20. Suitable thick-film polymer compositions typically include a resin, photosensitive agents and hardeners. The resin component can be any suitable liquid resin or solid resin, so as to enable the resin mixture to be readily deposited onto the surface of the substrate 18 in liquid form or as a laminate to form the dielectric layer 20. Resins that could be used include thermoplastic resins, thermosetting resins, elastomers and mixtures thereof, which when incorporated with a photosensitive material yield a photoimageable composition. Desirable properties for the thick-film polymer include physical properties that remain stable throughout deposition and photoimaging of the dielectric layer 20. According to this invention, the dielectric layer 20 serves as a permanent dielectric layer of the circuit structure on the substrate 18, such that the dielectric properties of the thin-film polymer also preferably remain stable throughout the deposition and photoimaging processes. For the above reasons, epoxies are particularly suitable as the resin for the dielectric layer 20, with preferred epoxy-base compositions being LMB 7081 and LMB 7082 commercially available from Ciba-Geigy.

Due to the presence of photosensitive agents, exposure of the dielectric layer 20 to appropriate electromagnetic radiation can be performed through a mask (not shown) to precisely photochemically pattern the dielectric layer 20. The dielectric layer 20 is subsequently developed to remove soluble portions of the layer 20 that were not polymerized during photoimaging, while polymerized (insoluble) portions of the layer 20 remain adhered to the surface of the substrate 18. In FIG. 1, a first portion 22 of the dielectric layer 20 has been polymerized while the remaining portion 24 of the dielectric layer 20 surrounding the portion 22 remains unpolymerized. As will become clear from the following discussion, the polymerized portion 22 establishes the width and length of the resistive layer 14 shown in FIG. 4.

In FIG. 2, a laminate foil 26 has been applied to the surface of the dielectric layer 20 prior to development of the dielectric layer 20. The foil 26 includes a resistive layer 28 and a sacrificial carrier layer 30 that facilitates lamination of the thin resistive layer 28 to the dielectric layer 20. In a preferred embodiment, the resistive layer 28 is a nickel-base alloy, preferably a nickelphosphorus or nickel-chromium alloy, while the carrier layer 30 is a copper foil. A preferred resistive layer 28 is formed of a nickel-phosphorus alloy containing a maximum of fifty weight percent of phosphorus, with the balance nickel and incidental impurities. A preferred thickness for the resistive layer 28 is about 0.01 to about 0.5 micrometer to allow permeation of the developer through the layer 28 during development of the dielectric layer 20. A preferred thickness for the copper carrier layer 30 is about four to about fifty micrometers. Once the foil 26 is laminated to the dielectric layer 20, the carrier layer 30 is removed to leave the resistive layer 28 adhered to the surface of the dielectric layer 20. If formed of copper, the carrier layer 30 can be readily stripped by known methods, such as with conventional alkaline ammoniacal etchants.

As shown in FIG. 3, the dielectric layer 20 is then developed, and in doing so the portion of the resistive layer 28 overlying the unpolymerized portion 24 of the dielectric layer 20 is also removed with the dissolving dielectric material. The portion of the resistive layer 28 remaining is the resistive film 14 of the resistor 12 shown in FIG. 4. Thereafter, a second photodefinable dielectric layer 32 is preferably applied to the circuit board 10, i.e., over the substrate 18 and the remaining resistive film 14. This dielectric layer 32 is photoimaged and developed to form openings 34 through which the terminations 16 are formed, such as by known plating techniques. As a result, the edges of the termination 16 are photodefined such that the electrical length of the resistor 12 can be accurately determined. In an alternative embodiment shown in FIGS. 5 through 8, the terminations 16 are formed by appropriately etching the copper carrier layer 30, instead of completely removing the carrier layer 30 as done in FIGS. 1 through 4. A disadvantage with the alternative approach is reduced tolerance control and undercutting of the terminations 16 as a result of the subtractive etching step used to form the terminations 16 from the copper carrier layer 30.

From the above, those skilled in the art will appreciate that the resulting resistor 12 is characterized by a precise width corresponding to the width of the polymerized portion 22 of the dielectric layer 20 achieved by photoimaging, and a precise length determined by the photoimaged openings 34 in the second dielectric layer 32. Modifications to the above process are foreseeable while retaining the desired accuracy made possible by photoimaging. For example, with sufficiently thin resistive layers 28 or optically transparent resistive layers 28 such as indium tin oxide, the dielectric layer 20 could be photoimaged through the resistive layer 28, instead of photoimaging the dielectric layer 20 prior to laminating the foil 26 to the dielectric layer 20 as described above. To do so, the resistive layer 28 also preferably has electromagnetic properties that enable electromagnetic penetration for the electromagnetic radiation of a predetermined frequency, propagational direction, and intensity sufficient to activate the photosensitive characteristics of the dielectric layer 20. Furthermore, the resistive layer 28 could be formed by evaporating, sputtering, or electroless plating a resistive film onto the dielectric layer 20.

While our invention has been described in terms of particular embodiments, it is apparent that other forms could be adopted by one skilled in the art. For example, as evidenced by the annular-shaped resistor 12 shown in FIG. 9, the configuration of the resistor 12 can vary considerably from those shown in FIGS. 1 through 8. Accordingly, the scope of our invention is to be limited only by the following claims.

What is claimed is:

1. A method for manufacturing a microelectronic assembly having a resistor structure on a substrate having a first region and a second region, the method comprising the steps of:

applying a photosensitive dielectric to the substrate to form a first dielectric layer that covers the first region and the second region, the photosensitive dielectric being capable of a soluble state and an insoluble state;

exposing the first dielectric layer to electromagnetic radiation to produce the insoluble state for a first portion of the first dielectric layer on the first region and the soluble state for a second portion of the first dielectric layer on the second region;

laminating a multilayer film onto the first dielectric layer, said multilayer film comprising an electrically resistive layer and a carrier layer, said multilayer film being laminated such that the electrically resistive layer lies adjacent the dielectric layer and said carrier layer is exposed, removing a portion of the carrier layer to expose the resistive layer overlying the second portion of the first dielectric layer; and developing the first dielectric layer to remove concurrently the second portion of the first dielectric layer and a portion of the electrically resistive layer overlying the second portion of the first dielectric layer so that a remnant portion of the electrically resistive layer remains over the first portion of the first dielectric layer.

2. The method according to claim 1 wherein the electrically resistive layer is composed of nickel and a maximum of fifty weight percent of phosphorus.

3. The method according to claim 1 wherein the carrier layer is composed of copper and the electrically resistive layer is composed of nickel phosphorus.

4. The method according to claim 3 wherein the step of removing a portion of the carrier layer comprises etching the copper to expose the nickel phosphorus.

5. The method according to claim 1 further comprising the step of fabricating the multilayer film comprising a resistive layer and a carrier layer, the resistive layer composed of an electrically resistive material selected from the group consisting of a nickel alloy, nickel-phosphorus, and nickel-chromium.

6. The method according to claim 1 further comprising the step of fabricating the multilayer film comprising a resistive layer and a carrier layer, the resistive layer composed of a nickel-phosphorus alloy and having a thickness within a range of approximately 0.01 micrometer to approximately 0.5 micrometer.

7. The method according to claim 1 further comprising the step of fabricating the multilayer film comprising a resistive layer and a carrier layer, the carrier layer composed of a copper foil and having a thickness within a range from approximately 4 micrometers to approximately 50 micrometers and the resistive layer composed of a nickel-phosphorus alloy and having a thickness within a range of approximately 0.01 micrometer to approximately 0.5 micrometer.

8. The method according to claim 1 wherein the step of exposing the first dielectric layer is accomplished by selectively exposing the first dielectric layer through the electrically resistive layer, the method further comprising the step of forming the electrically resistive layer to have a thickness and electromagnetic properties that enable electromagnetic penetration through the electrically resistive layer for the electromagnetic radiation of a frequency, a propagational direction, and a intensity sufficient to activate photosensitive characteristics of the photosensitive dielectric thereby yielding the soluble state on the second region and the insoluble state on the first region.

9. The method according to claim 1 wherein the step of developing the first dielectric layer is performed to yield the remnant portion of the electrically resistive layer at a desired resistor location.

10. The method according to claim 1 wherein the step of removing a portion of the carrier layer to expose the resistive layer overlying the second portion of the first dielectric layer includes concurrently removing a portion of the carrier layer overlying the first portion of the first dielectric layer, and wherein the method further comprises the steps of:

applying a second dielectric layer to the substrate to cover the remnant portion of the electrically resistive layer, and forming openings in the second dielectric layer to expose the remnant portion of the electrically resister layer, and plating metal through the openings in the second dielectric layer to form terminations connected to the electrically resistive layer.

11. The method according to claim 1 wherein the step of removing a portion of the carrier layer includes etching the carrier layer to define terminations overlying the first portion of the first dielectric layer.

* * * * *